(12) United States Patent
Shimada et al.

(10) Patent No.: US 6,201,226 B1
(45) Date of Patent: Mar. 13, 2001

(54) PROBE WITH TIP HAVING MICRO APERTURE FOR DETECTING OR IRRADIATING LIGHT, NEAR-FIELD OPTICAL MICROSCOPE, RECORDING/ REPRODUCTION APPARATUS, AND EXPOSURE APPARATUS USING THE PROBE, AND METHOD OF MANUFACTURING THE PROBE

(75) Inventors: Yasuhiro Shimada, Hadano; Ryo Kuroda, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/025,036

(22) Filed: Feb. 18, 1998

(30) Foreign Application Priority Data

Feb. 19, 1997 (JP) .................................................. 9-051073
Feb. 10, 1998 (JP) .................................................. 10-044402

(51) Int. Cl.[7] .................................................. G02B 7/04
(52) U.S. Cl. .................................. 250/201.3; 250/306
(58) Field of Search ............................. 250/234, 201.3, 250/306, 307

(56) References Cited

U.S. PATENT DOCUMENTS

| 5,260,567 | * | 11/1993 | Kuroda et al. ...................... 250/306 |
| 5,294,790 | * | 3/1994 | Ohta et al. ........................... 250/306 |
| 5,354,985 | | 10/1994 | Quate ................................... 250/234 |
| 5,517,280 | | 5/1996 | Quate ................................... 355/71 |
| 5,546,375 | | 8/1996 | Shimada et al. ..................... 369/126 |
| 5,548,117 | * | 8/1996 | Nakagawa ............................ 250/306 |
| 5,770,856 | * | 6/1998 | Fillard et al. ........................ 250/234 |

FOREIGN PATENT DOCUMENTS

| 0 112 402 | 7/1984 | (EP) . |
| 0 786 642 | 7/1997 | (EP) . |
| 2-98849 | 4/1990 | (JP) . |
| 4-90152 | 3/1992 | (JP) . |

OTHER PUBLICATIONS

Radmacher, M., et al., "Scanning Nearfield Optical Microscope Using Microfabricated Probes", Review of Scientific Instruments, vol. 65, No. 8, pp. 2737–2738 (Aug. 1994).
Akamine, S., et al., "Low temperature Thermal Oxidation Sharpening of Microcast Tips", Journal of Vacuum Science & Technology, vol. 10, No. 5, pp. 2307–2310 (Sep. 1992).
van Hulst, N.F., et al., "Near–Field Optical Microscope Using a Silicon–Nitride Probe", vol. 62, No. 5, pp. 461–463 (Feb. 1993).

* cited by examiner

*Primary Examiner*—Que T. Le
(74) *Attorney, Agent, or Firm*—Fitzpatrick, Cella, Harper & Scinto

(57) ABSTRACT

A probe for detecting or irradiating light includes a displaceable support member on a substrate, a tip formed on the support member, and a bonding layer for bonding the tip onto the support member. The tip has a micro aperture. When a light-shielding layer is further formed on a surface of the tip, the micro aperture is formed on the light-shielding layer. The tip consists of a light transmission material.

14 Claims, 11 Drawing Sheets

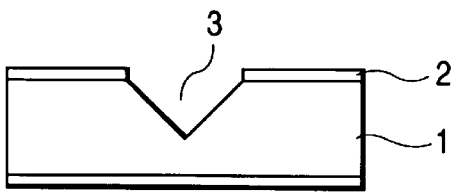
FIG. 10A
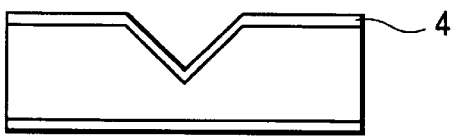
FIG. 10B
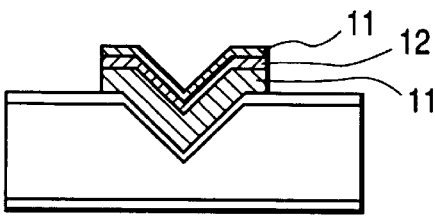
FIG. 10C
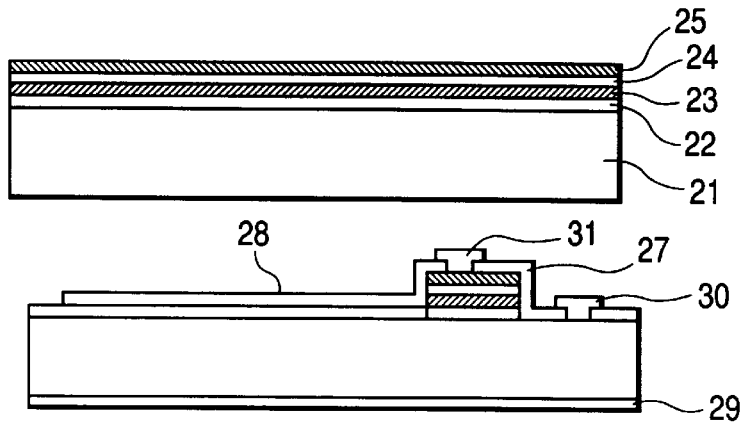
FIG. 10D
FIG. 10E
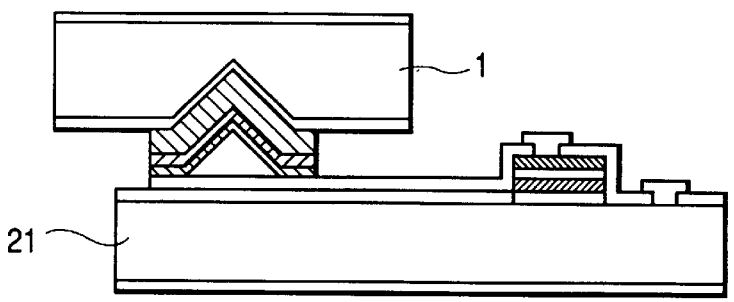
FIG. 10F
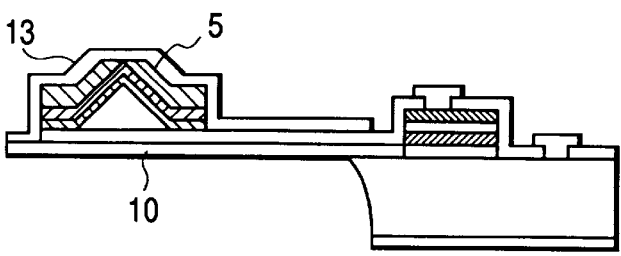
FIG. 10G

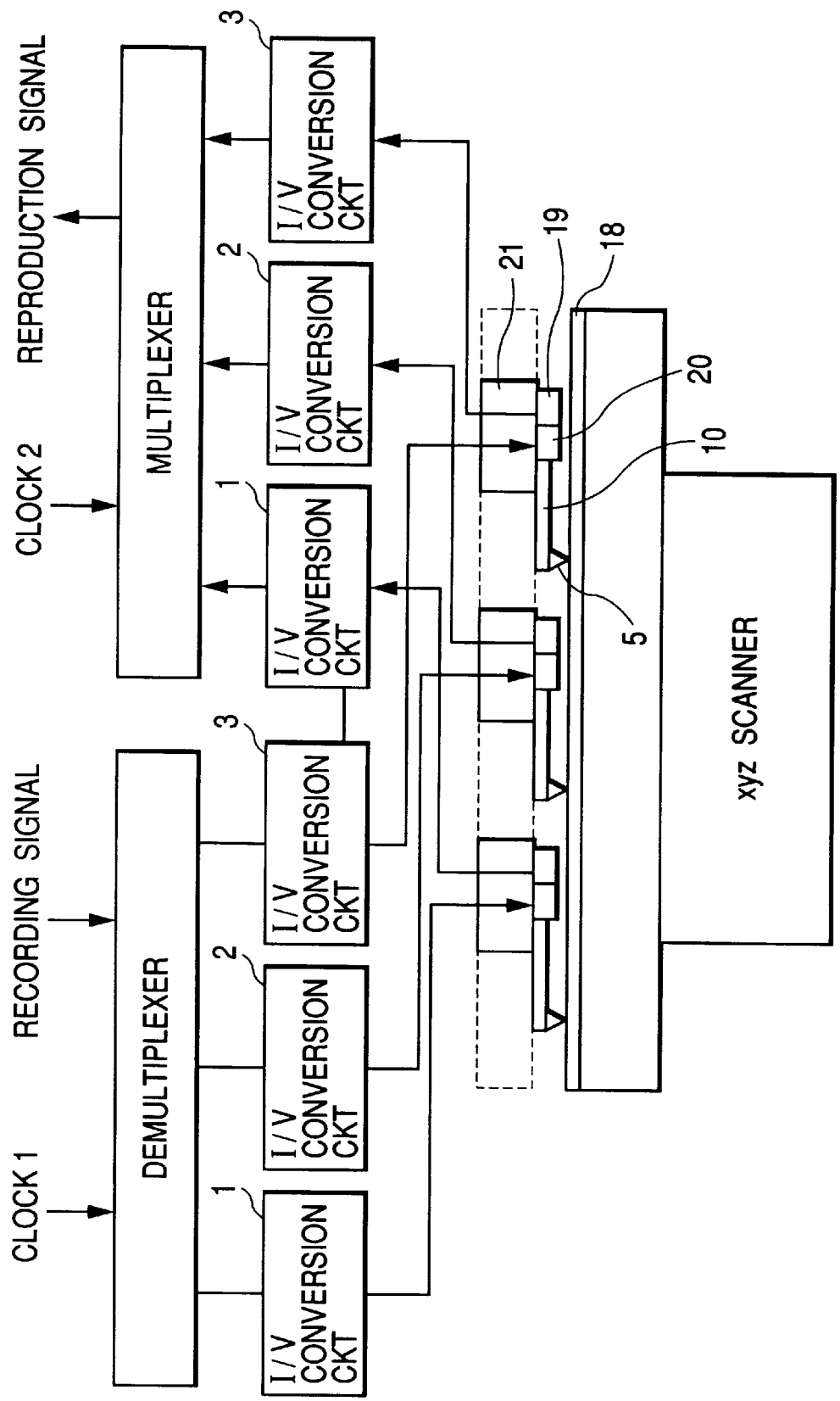

PROBE WITH TIP HAVING MICRO APERTURE FOR DETECTING OR IRRADIATING LIGHT, NEAR-FIELD OPTICAL MICROSCOPE, RECORDING/ REPRODUCTION APPARATUS, AND EXPOSURE APPARATUS USING THE PROBE, AND METHOD OF MANUFACTURING THE PROBE

BACKGROUND OF THE INVENTION

1. Field of the Invention

The present invention relates to a probe having a tip (stylus) with a micro aperture for detecting or irradiating evanescent light and used in, e.g., a near-field optical microscope or the like, a near-field optical microscope, recording/ reproduction apparatus, and exposure apparatus using the probe, and a method of manufacturing the probe.

2. Related Background Art

Recently, since the development of a scanning tunneling microscope (to be abbreviated as an "STM" hereinafter) that can directly observe the electron structure of surface atoms of a conductor (G. Binnig et al., Phys. Rev. Lett, 49, 57 (1982)) to allow high-resolution measurement of real space images irrespective of single crystal and amorphous, a scanning probe microscope (to be abbreviated as an "SPM" hereinafter) has been enthusiastically studied in the field of microstructural evaluation of materials.

As an SPM, a scanning tunneling microscope (STM), atomic force microscope (AFM), magnetic force microscope (MFM), and the like for detecting the surface structure using a tunneling current, atomic force, magnetic force, light, and the like obtained by bringing a probe with a micro tip close to a sample are known.

As one developed form of the STM, a scanning near-field optical microscope (to be abbreviated as an "SNOM" hereinafter) [Durig et al., J. Appl. Phys. 59, 3318 (1986)] for examining the sample surface by detecting evanescent light leaking out from a micro aperture at the sharp probe distal end using an optical probe from the sample surface has been developed.

Furthermore, a photon STM (to be abbreviated as a "PSTM" hereinafter) [Reddick et al., Phys. Rev. B39, 767 (1989)] as a one kind of SNOM for examining the sample surface by making light enter the sample rear surface via a prism under the total reflection condition, and detecting evanescent light leaking out through the sample surface using an optical probe from the sample surface has also been developed.

In the SNOM, since the distal end diameter of the optical probe determines resolution, the probe surface is shielded from light and a micro aperture is formed at the distal end to reduce the exit size of light. As a method of forming such micro aperture, the following method has been proposed. That is, a metal is coated on the intersection of the cleaved surfaces of a transparent crystal, and the crystal is pressed against a hard surface to remove the metal at the intersection portion and expose the intersection, thus forming a micro aperture (see FIG. 14A) (European Patent No. EP0112402). In another method, the distal end of an optical fiber is sharpened by etching, and a metal is evaporated on the optical fiber from only a given direction while rotating the fiber so as to form a portion on which no metal is evaporated, thereby forming a micro aperture (see FIG. 14B).

However, of the above-mentioned prior arts, when the optical probe has no micro aperture like in the PSTM, stray light other than evanescent light such as light scattered by the three-dimensional pattern on the sample surface is detected, thus dropping the resolution.

On the other hand, the prior arts shown in FIGS. 14A and 14B have poor productivity and can hardly attain integration and size reduction of the micro aperture since they present micro aperture formation processes for only one fiber probe. Also, high cost is required due to complicated, time-consuming processes. Furthermore, it is hard to strictly control the diameter of the micro aperture, resulting in poor reproducibility. If an EB working apparatus or FIB working apparatus is used, formation of an aperture with a diameter of 100 nm or less may be realized in principle. However, positioning control of such apparatus is complicated, and variations are readily produced. Moreover, since such working method must be done for each point, the yield is poor.

SUMMARY OF THE INVENTION

The present invention has been made in consideration of the prior arts' problems, and has as its object to provide:

a micro aperture or a tip with the micro aperture
(1) which can be formed with high reproducibility,
(2) which can be easily integrated on a substrate, and can reduce variations of aperture diameter upon forming a plurality of micro apertures, and
(3) which has high reproducibility since it can be formed in a batch process; and
(4) an integrated, compact optical probe, near-field optical microscope, recording/reproduction apparatus, and exposure apparatus using the micro aperture or the tip with the micro aperture, and a method of manufacturing the micro aperture or the tip with the micro aperture, and a probe.

In order to achieve the above object, there is provided a probe for detecting or irradiating light, comprising:

a displaceable support member supported on a substrate;
a tip formed on the support member and having a micro aperture; and
a bonding layer for bonding the tip onto the support member.

In order to achieve the above object, there is also provided a near-field optical microscope comprising the above-mentioned probe.

In order to achieve the above object, there is also provided a recording/reproduction apparatus comprising the above-mentioned probe.

In order to achieve the above object, there is also provided an exposure apparatus comprising the above-mentioned probe.

In order to achieve the above object, there is also provided a method of manufacturing a probe for detecting or irradiating light, comprising the steps of:

forming a recess portion on a surface of a first substrate;
forming a peeling layer on the first substrate including the recess portion;
forming a tip consisting of a light transmission material on the peeling layer including the recess portion;
forming a bonding layer on a second substrate;
bonding and transferring the tip onto the bonding layer; and
forming a support member for supporting the tip by removing a portion of the second substrate.

BRIEF DESCRIPTION OF THE DRAWINGS

FIGS. 10A, 10B, 10C, 10D, 10E, 10F and 10G are sectional views showing the manufacturing processes of the probe of the third embodiment;

FIG. 11 is a view showing the arrangement of a recording/reproduction apparatus using the probe of the third embodiment;

DETAILED DESCRIPTION OF THE EMBODIMENTS

Figure 1:
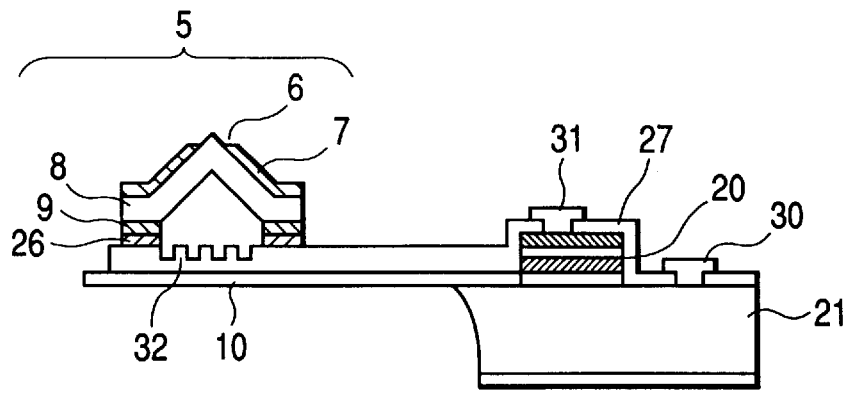
FIG. 1 is a sectional view showing a probe according to the first embodiment of the present invention.
Figure 2A:
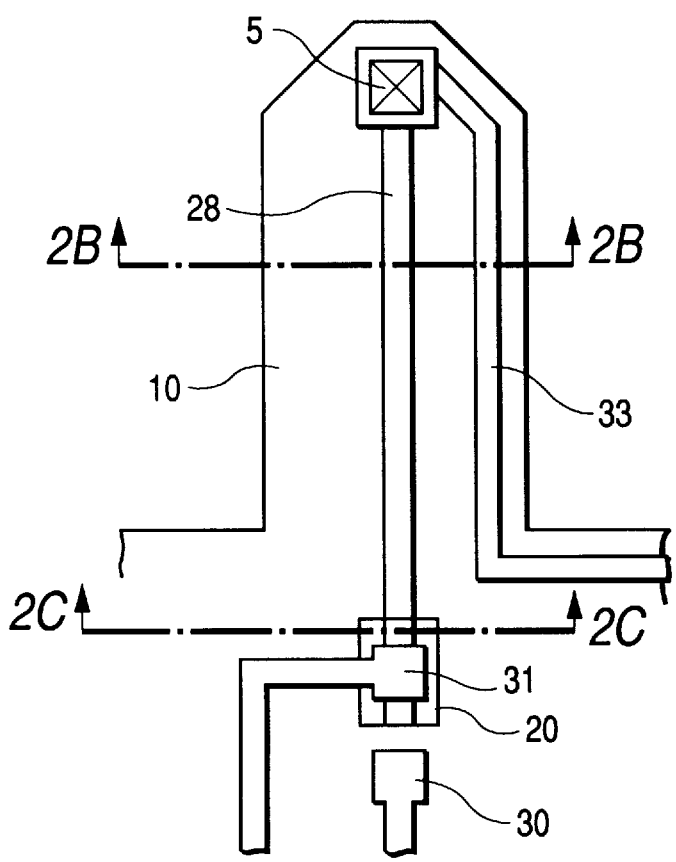
FIG. 2A is a top view showing the probe of the first embodiment.
Figure 2B:
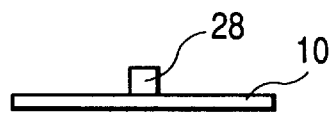
FIG. 2B is a sectional view taken along a line 2B—2B in FIG. 2A.
Figure 2C:
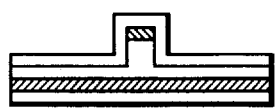
FIG. 2C is a sectional view taken along a line 2C—2C in FIG. 2A.

The present invention can realize its object with the above-mentioned arrangements.

The present invention will be described in detail hereinafter with reference to the accompanying drawings.

A probe according to the present invention is a probe for detecting or irradiating evanescent light, and comprises an elastic member (support member) 10 formed on a substrate 21, a tip 5 for evanescence formed on the free end portion of the elastic member, a light-receiving element 19 or laser 20, and a waveguide 28 for optically connecting the light-receiving element 19 or laser 20 and the tip 5.

FIGS. 3A to 3G are sectional views showing an example of the manufacturing processes of the probe. The manufacturing method will be explained below with reference to FIGS. 3A to 3G.

First, a recess portion 3 is formed on the surface of a first substrate 1 consisting of silicon. In order to form such recess portion, a protection layer 2 is formed on the first substrate 1, and a desired portion of the protection layer 2 is patterned by photolithography and etching to expose the silicon. The exposed silicon portion is etched by, e.g., crystallographic axis anisotropic etching, so as to form the recess portion 3. As the protection layer 2, silicon dioxide or silicon nitride may be used.

Silicon is preferably etched by crystallographic axis anisotropic etching since it can form a tip 5 with a sharp distal end. When a potassium hydroxide aqueous solution or the like is used as an etchant, an inverted pyramidal recess portion 3 surrounded by four surfaces equivalent to the (111) face can be formed (see FIG. 3A).

Figure 3A:
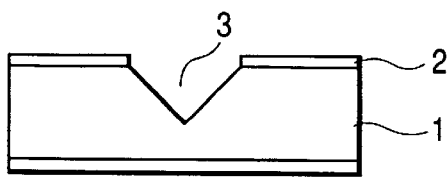
FIGS. 3A, 3B, 3C, 3D, 3E, 3F and 3G are sectional views showing the manufacturing processes of the probe of the first embodiment.
Figure 3B:
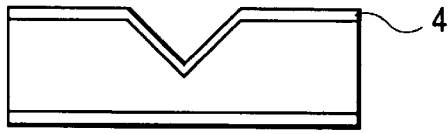

Second, a peeling layer 4 consisting of an oxide is formed on the first substrate 1 including the recess portion 3 (see FIG. 3B).

Since the tip 5 is formed on the peeling layer 4 and is then peeled from the peeling layer 4 in a process after formation of the peeling layer 4, a material that allows easy peeling of the material of the tip 5 must be selected for the peeling layer 4. More specifically, the material of the peeling layer 4 must have low reactivity and adhesion with the material of the tip 5.

Such material includes, for example, BN, AlN, $Al_2O_3$, $Si_3N_4$, $SiO_2$, TiN, $TiO_2$, $VO_2$, $Cr_2O_3$, $ZrO_2$, $Ta_2O_5$, $WO_3$, and the like. These materials can be formed by sputtering or vacuum evaporation. Especially, when the first substrate 1 consists of silicon, silicon dioxide ($SiO_2$) that can be obtained by oxidizing the substrate surface is preferable.

Third, the tip 5 is formed on the peeling layer including the recess portion. A light transmission material is used for a light transmission portion of the tip 5.

Such material includes inorganic materials such as $SiO_2$, SiN, or the like, and organic materials such as polyimide, and the like. When a light transmission conductive material such as ITO or the like is used, the obtained probe can be used in an SNOM/STM hybrid apparatus that measures resistance by applying a voltage to a sample. When the light transmission layer itself has insufficient peeling properties from the peeling layer, a peeling assist layer may be formed on the surface of the light transmission layer. As such assist layer, a metal such as Au or the like may be used. On the other hand, when the light transmission layer has insufficient adhesion with a bonding layer, a bonding assist layer may be formed on the interface with the bonding layer. As such assist layer, a metal such as Au or the like may be used.

Figure 3C:
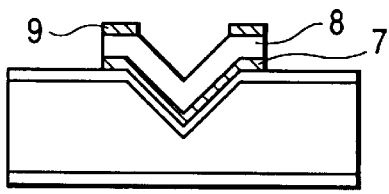

The film formation of the individual materials of the tip 5 can use vacuum evaporation, sputtering, chemical vapor deposition, or the like as a thin film formation technique. After film formation, the material of the tip 5 is patterned by known photolithography (FIG. 3C).

Fourth, a light-receiving element or laser and its waveguide are formed as a light-emitting or light-receiving mechanism.

Figure 3D:
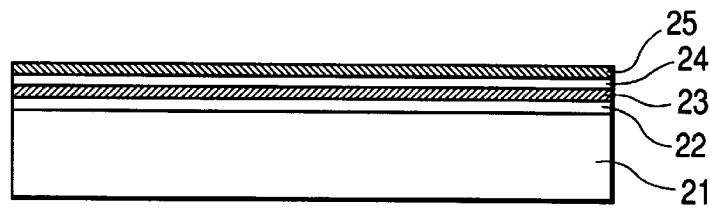
Figure 3E:
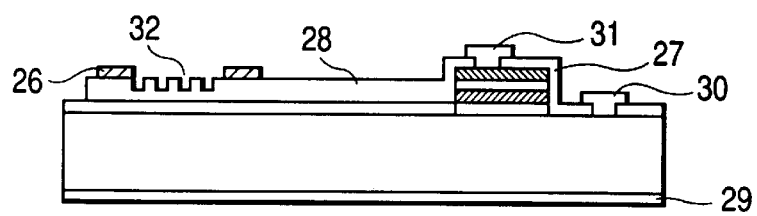

Upon forming such components, a known silicon process or compound semiconductor process may be used (see FIGS. 3D and 3E).

Fifth, a bonding layer 26 is formed on the substrate 21 or the elastic member 10 formed on the substrate 21.

The second substrate 21 and elastic member 10 serve as a member for supporting the tip 5 via the bonding layer 26. The bonding layer bonds the tip 5 by pressure, and if the tip 5 and bonding layer 26 consist of metals, a metallic bond can be obtained since they deform against each other by pressure. Hence, as the material, a metal, especially, a metal with high ductility and malleability such as Au, Pt, or the like is preferable.

Figure 3F:
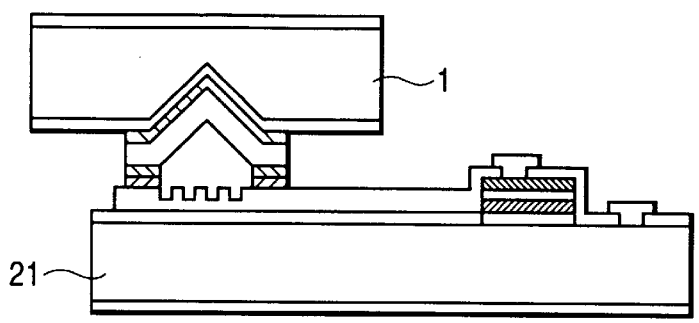
Figure 3G:
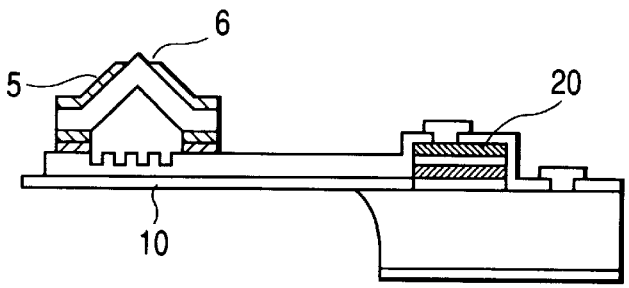

Sixth, the material of the tip 5 on the peeling layer 4 including the recess portion 3 is bonded to the bonding layer 26. In this process, an alignment apparatus, which can hold the individual substrates by vacuum chucks and the like, is used. After the tip 5 on the first substrate 1 and the bonding layer 26 on the second substrate 21 are aligned to face each other, they are brought into contact with each other and pressurized, thus bonding the tip 5 and the bonding layer 26 (pressure bonding) (FIG. 3F).

Seventh, peeling is done at the interface between the peeling layer 4 and tip 5 to transfer the material of the tip 5 onto the bonding layer 26.

More specifically, when the first and second substrates 1 and 21 are separated away from each other, the tip 5 is peeled from the peeling layer 4 at their interface.

Eighth, a micro aperture for detecting or irradiating light is formed at the distal end of the tip 5.

For example, the tip distal end portion of the light transmission layer covered by a metal layer 7 as a light-shielding layer is brought into contact with a metal substrate, and a voltage is applied across the distal end of the tip 5 and the metal substrate via electrode wiring. Upon application of the voltage, a coating metal film portion at the distal end of the tip 5 is removed by electric field evaporation or heat fusion, thus forming a micro aperture.

In practice, a tip, which used Au as the metal layer 7 and $SiO_2$ as the light transmission layer, was brought into contact with an Au metal substrate while controlling the elastic deformation amount of an elastic cantilever having an elastic constant of 0.1 [N/m] to 1 [μm] or less, i.e., controlling the contact force to $10^{-7}$ [N] or less, and a voltage (crest value: 10 [V], waveform: rectangular wave, time duration: 100 [μs], load resistance: 1 [MΩ]) was applied thereto. As a result, the micro aperture formed had a diameter of about 20 [nm].

Alternatively, the tip 5 may be formed to have a multi-layered structure using materials having different refractive indices, and may be scanned on the sample surface with a load so as to polish the top surface layer, thus forming a micro aperture at the waveguide portion.

The present invention also includes a surface observation apparatus and recording/reproduction apparatus using the probe manufactured by the above-mentioned processes.

This probe is brought close to or into contact with a sample and is two-dimensionally scanned by an x-y actuator relative to the sample in the plane of the sample so as to detect evanescent light leaking out through the sample surface. In this way, the surface state of the sample can be observed.

On the other hand, this probe is used to cause changes in a surface state in a micro region on a recording medium, and such changes in surface state are observed, thus realizing a recording/reproduction apparatus. In this case, the SNOM signal itself can be used in interval control or contact force control with the sample or recording medium.

When the tip (tip 5) is present on the elastic member, a technique such as an optical lever, piezoresistance element, or the like used in an AFM may be used. Also, a technique used in an STM or a technique based on the shear force may be used, and these means do not limit the present invention.

By executing parallel processing of information using a multi probe that carries a plurality of probes according to the present invention, a surface observation apparatus or recording/reproduction apparatus with a high transfer rate can be provided.

Since the SNOM probe according to the present invention is formed on the elastic cantilever, the magnitude of the contact force between the tip (tip 5) distal end and the sample can be controlled to a given value or less while the tip (tip 5) distal end contacts the sample.

For example, let k be the elastic constant of the elastic cantilever, and Δz be the maximum amount of positional variations of the tip distal end in the z-direction. Then, since contact force variations while all tip (tip 5) distal ends contact the surface of the recording medium or sample are represented by kΔz, the magnitudes of all the contact forces can be controlled to kΔz or less by controlling the position between the second substrate 21 and the recording medium or sample in the z-direction. In this fashion, the tip (tip 5) distal end, or the recording medium or sample can be prevented from being destroyed by an excessive contact force applied.

The detailed embodiments of the present invention will be explained below.

[First Embodiment]

The first embodiment is directed to an evanescent light probe and its manufacturing method according to the present invention. FIGS. 1 and 2A to 2C show the structure of the probe.

The probe of this embodiment comprises an elastic lever 10 formed on a substrate 21, a tip 5 which is formed on the free end portion of the elastic lever and irradiates evanescent light, a laser 20, and a waveguide 28 for optically connecting the laser 20 and the tip 5.

FIGS. 3A to 3G are sectional views showing the manufacturing processes of the evanescent light probe according to this embodiment.

The manufacturing method will be explained below with reference to FIGS. 3A to 3G.

A (100) single-crystal silicon wafer was prepared as a first substrate 1.

A 100-nm thick silicon thermal oxide film was formed as a protection layer 2. A desired portion of the protection layer 2 was patterned by photolithography and etching to expose 10-$μm^2$ silicon.

The silicon exposed from the patterned portion was etched by crystallographic axis anisotropic etching using an aqueous potassium hydroxide solution.

Note that the etching conditions were: a 30% aqueous potassium hydroxide solution was used, and a solution temperature of 90° C. and an etching time of 10 min were set.

At this time, a inverted pyramidal recess portion 3 having a depth of about 7 μm and surrounded by four surfaces equivalent to the (111) plane was formed (see FIG. 3A).

The thermal oxide film as the protection layer 2 was then removed by an aqueous solution mixture of hydrogen fluoride and ammonium fluoride ($HF:NH_4F=1:5$). After the removal, the first substrate 1 was washed using a solution mixture of sulfuric acid and hydrogen peroxide heated to 120° C., and a 2% aqueous hydrofluoric acid solution. The first substrate 1 was heated to 1,000° C. in an oxygen/hydrogen atmosphere using an oxidization oven to deposit a 500-nm thick silicon dioxide ($SiO_2$) film serving as a peeling layer 4 (see FIG. 3B).

The film formation for the material of the tip 5 was done. A 0.1-μm thick gold (Au) film was formed by vacuum evaporation to obtain a metal film 7, and a 0.6-μm thick ITO (indium tin oxide) film was formed by sputtering to obtain a light transmission layer 8. These films were then patterned by photolithography and etching. In this case, Au etching used an aqueous solution mixture of Kl and $I_2$, and ITO etching used an aqueous solution mixture of HCl and $FeCl_3$. After patterning, a 0.3-μm thick gold (Au) film was formed again by vacuum evaporation, and was patterned by photolithography and etching to obtain a bonding assist layer 9 (see FIG. 3C).

A 300-μm thick single-crystal n-InP substrate was used as a second substrate 21, and a 1-μm thick n-InP buffer layer 22, a 0.1-μm thick InGaAsP active layer 23, a 1.5-μm thick p-InP cladding layer 24, and a 0.3-μm thick p-InGaAs capping layer 25 were formed in turn on the substrate 21 by MOCVD (metal organic chemical vapor deposition) (see FIG. 3D).

The obtained multilayered structure was patterned and etched by photolithography to form a ridge structure, thus obtaining a laser 20. The wavelength of the laser formed by the above-mentioned method was 1.3 μm. Etching was done by RIBE (reactive ion beam etching) using $Cl_2$ gas. A 3-μm thick $SiO_2$ film as a lever material, insulating layer 27, and mask layer 29 was formed on both surfaces of the structure by sputtering. The $SiO_2$ films on both surfaces were patterned and etched by photolithography to form contact holes, a cantilever structure, and a mask layer 29.

The thickness of the cantilever was 1 μm. A 200-nm thick AuGe film and 300-nm thick Au film were deposited by vacuum evaporation, and were patterned and etched by photolithography to form a bonding layer 26, wiring electrode 33, and output electrode 30 on the substrate side. A 3-μm thick $SIO_2$ film as a waveguide 28 was deposited by sputtering. The waveguide 28 was then formed by photolithography and etching. The etchant used was an aqueous solution mixture of hydrochloric acid (HCl) and phosphoric acid ($H_3PO_4$). In this case, the projecting portion of the waveguide formed a secondary diffraction grating. From this grating, light inside the waveguide can be output upward. The waveguide 28 had a height of 2 μm and a width of 5 μm. A 50-nm thick Cr film and 300-nm thick Au film were deposited by vacuum evaporation, and were patterned and etched by photolithography to form an output electrode 31 of the capping layer (see FIG. 3E).

After the tip 5 on the first substrate 1 and the bonding layer 26 on the second substrate 21 were aligned to face each other, they were brought into contact with each other and were pressurized, thus bonding the tip 5 and the bonding layer 26 (pressure bonding) (FIG. 3F).

The first and second substrates 1 and 21 were separated from each other to peel the peeling layer 4 and tip 5 at their interface.

After a protection film was formed on the surface of the second substrate, the n-InP substrate was etched from its rear surface using an aqueous HCl solution to form an $SiO_2$ cantilever. After the formation of the cantilever, the protection film was removed.

Finally, the tip 5 covered by the metal layer 7 was brought into contact with a metal substrate, and a voltage was applied across the tip 5 and metal substrate via the wiring electrode 33 by a voltage application means.

Upon application of the voltage, a micro aperture was formed at the tip distal end portion of the metal layer 7. The diameter of the aperture was about 20 nm (see FIG. 3G).

Figure 4:
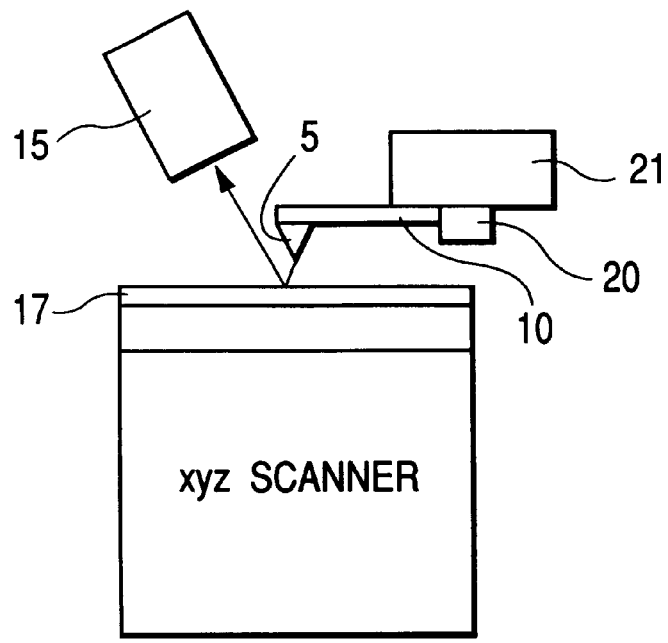
FIG. 4 is a view showing the arrangement of a surface observation apparatus using the probe of the first embodiment.

FIG. 4 shows the arrangement of an observation apparatus using the probe of this embodiment. A sample 17 is placed on a holder on an x-y-z scanner. The probe of this embodiment is set to oppose the sample 17, and x-y scanning is done while the tip 5 contacts the sample 17.

In this process, evanescent light irradiated from the tip onto the surface of the sample 17 and reflected thereby is focused using an objective lens, and is detected using a photomultiplier, thus allowing surface observation.

[Second Embodiment]

The second embodiment is directed to another evanescent light probe and its manufacturing method according to the present invention.

Figure 5:
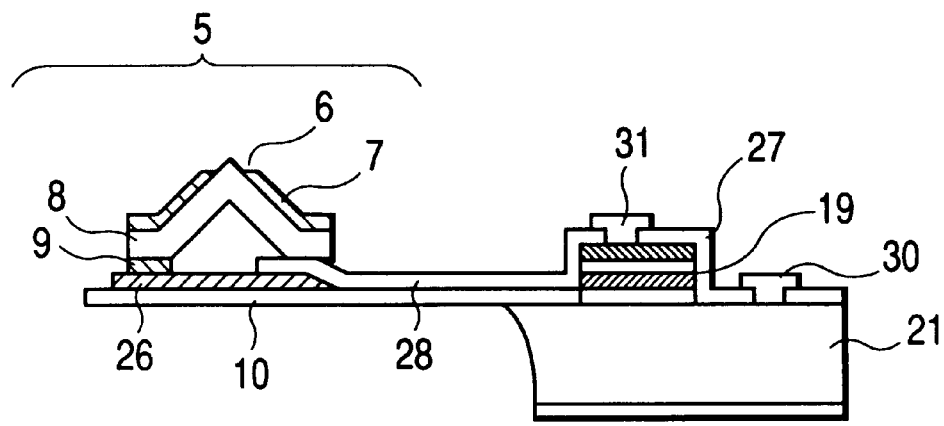
FIG. 5 is a sectional view showing a probe according to the second embodiment of the present invention.

FIG. 5 shows the structure of the probe. The probe of this embodiment comprises an elastic lever 10 formed on a substrate 21, a tip 5 which is formed on the free end portion of the elastic lever and detects evanescent light, a light-receiving element 19, and a waveguide 28 for optically connecting the light-receiving element 19 and the tip 5.

The light-receiving element 19 has the same structure as that of the laser 20 used in the first embodiment, and when a reverse electric field is applied, carriers are excited and a current flows in response to incoming light. In this way, evanescent light can be detected. In this embodiment, a plurality of probes are disposed on the second substrate 21.

FIGS. 6A to 6G are sectional views showing the manufacturing processes of the evanescent light probe according to this embodiment.

The manufacturing method will be explained below with reference to FIGS. 6A to 6G.

A (100) single-crystal silicon wafer was prepared as a first substrate 1.

A 100-nm thick silicon thermal oxide film was formed as a protection layer 2. A desired portion of the protection layer 2 was patterned by photolithography and etching to expose 10-μm² silicon.

The silicon exposed from the patterned portion was etched by crystallographic axis anisotropic etching using an aqueous potassium hydroxide solution.

Note that the etching conditions were: a 30% aqueous potassium hydroxide solution was used, and a solution temperature of 90° C. and an etching time of 10 min were set. At this time, a inverted pyramidal recess portion 3 having a depth of about 7 μm and surrounded by four surfaces equivalent to the (111) plane was formed (see FIG. 6A).

The thermal oxide film as the protection layer 2 was then removed by an aqueous solution mixture of hydrogen fluoride and ammonium fluoride ($HF:NH_4F=1:5$). After the removal, the first substrate 1 was washed using a solution mixture of sulfuric acid and hydrogen peroxide heated to 120° C., and a 2% aqueous hydrofluoric acid solution. The first substrate 1 was heated to 1,000° C. in an oxygen/hydrogen atmosphere using an oxidization oven to deposit a 500-nm thick silicon dioxide ($SiO_2$) film serving as a peeling layer 4 (see FIG. 6B).

The film formation for the material of the tip 5 was done. A 0.1-μm thick gold (Au) film was formed by vacuum evaporation to obtain a metal film 7, and a 0.6-μm thick ITO (indium tin oxide) film was formed by sputtering to obtain a light transmission layer 8. These films were then patterned by photolithography and etching. In this case, Au etching used an aqueous solution mixture of KI and $I_2$, and ITO etching used an aqueous solution mixture of HCl and $FeCl_3$. After patterning, a 0.3-μm thick gold (Au) film was formed again by vacuum evaporation, and was patterned by photolithography and etching to obtain a bonding assist layer 9 (see FIG. 6C).

Figure 6A:
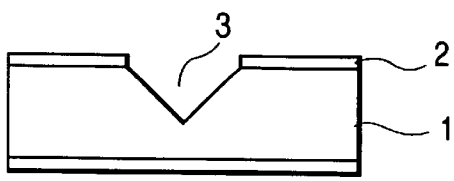
FIGS. 6A, 6B, 6C, 6D, 6E, 6F and 6G are sectional views showing the manufacturing processes of the probe of the second embodiment.
Figure 6B:
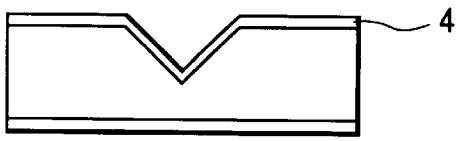
Figure 6C:
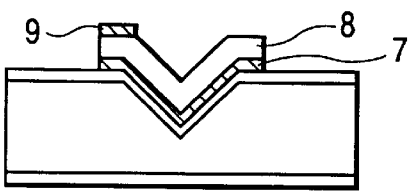
Figure 6D:
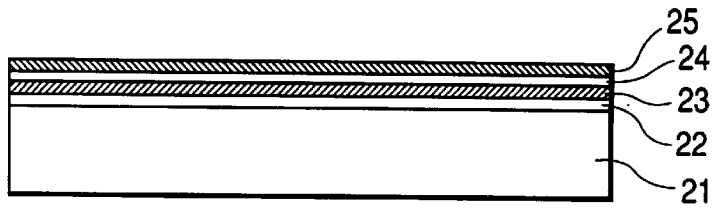
Figure 6E:
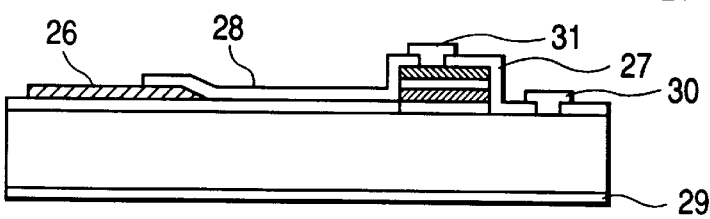

A 300-μm thick single-crystal n-InP substrate was used as a second substrate 21, and a 1-μm thick n-InP buffer layer 22, a 0.1-μm thick InGaAsP active layer 23, a 1.5-μm thick p-InP cladding layer 24, and a 0.3-μm thick p-InGaAs capping layer 25 were formed in turn on the substrate 21 by MOCVD (metal organic chemical vapor deposition) (see FIG. 6D).

The obtained multilayered structure was patterned and etched by photolithography to form a ridge structure, thus obtaining a light-receiving element 19. Etching was done by RIBE (reactive ion beam etching) using $Cl_2$ gas. A 3-μm thick $SiO_2$ film as a lever material, insulating layer 27, and mask layer 29 was formed on both surfaces of the structure by sputtering.

The SiO$_2$ films on both surfaces were patterned and etched by photolithography to form contact holes, a cantilever structure, and a mask layer 29.

The thickness of the cantilever was 1 μm. A 200-nm thick AuGe film and 300-nm thick Au film were deposited by vacuum evaporation, and were patterned and etched by photolithography to form a bonding layer 26, wiring electrode 33, and output electrode 30 on the substrate side.

In this case, Au etching used ion milling to taper the waveguide connection portion of the bonding layer.

A 3-μm thick SIO$_2$ film as a waveguide 28 was deposited by sputtering. The waveguide 28 was then formed by photolithography and etching. The etchant used was an aqueous solution mixture of hydrochloric acid (HCl) and phosphoric acid (H$_3$PO$_4$).

The waveguide 28 had a height of 2 μm and a width of 5 μm. A 50-nm thick Cr film and 300-nm thick Au film were deposited by vacuum evaporation, and were patterned and etched by photolithography to form an output electrode 31 of the capping layer (see FIG. 6E).

Figure 6F:
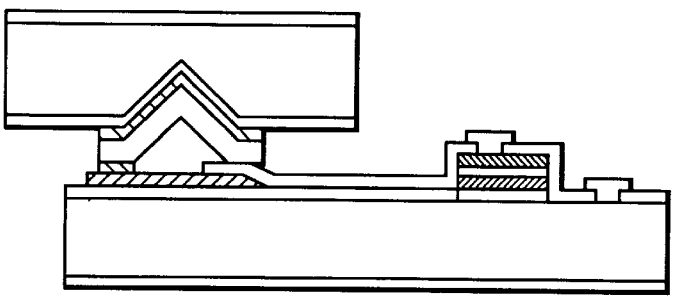
Figure 6G:
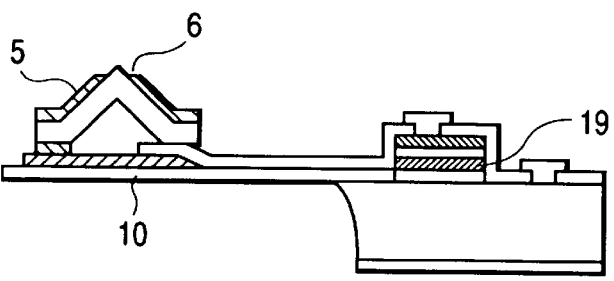

After the tip 5 on the first substrate 1 and the bonding layer 26 on the second substrate 21 were aligned to face each other, they were brought into contact with each other and were pressurized, thus bonding the tip 5 and the bonding layer 26 (pressure bonding) (FIG. 6F). The first and second substrates 1 and 21 were separated from each other to peel the peeling layer 4 and tip 5 at their interface.

After a protection film was formed on the surface of the second substrate, the n-InP substrate was etched from its rear surface using an aqueous HCl solution to form an SiO$_2$ cantilever. After the formation of the cantilever, the protection film was removed.

Finally, the tip 5 covered by the metal layer 7 was brought into contact with a metal substrate, and a voltage was applied across the tip 5 and metal substrate via the wiring electrode 33 by a voltage application means. Upon application of the voltage, a micro aperture was formed at the tip distal end portion of the metal layer 7. The diameter of the aperture was about 20 nm (see FIG. 6G).

As shown in FIGS. 5 and 6A to 6G, in this embodiment, the micro aperture is formed by forming a metal layer as a light-shielding layer. The structure of this embodiment that guides light detected by the tip toward the light-receiving element does not always require the light-shielding layer. However, the light-shielding layer is preferably arranged since the photodetection resolution can be improved.

Figure 7:
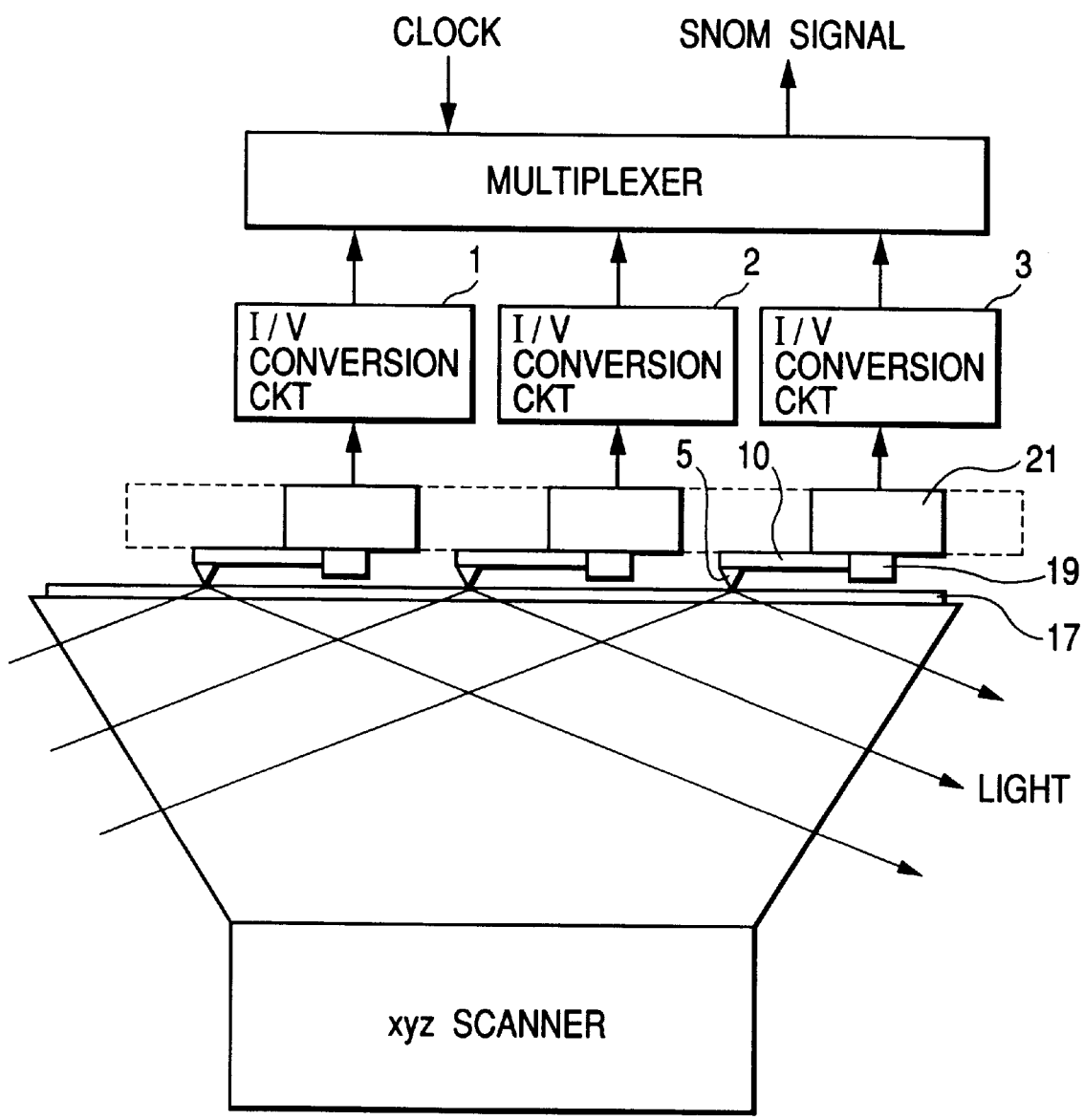
FIG. 7 is a view showing the arrangement of a surface observation apparatus using the probe of the second embodiment.

FIG. 7 shows the arrangement of an SNOM observation apparatus using the probes of this embodiment. A sample 17 is placed on a transparent substrate on an x-y-z scanner.

Light is irradiated to make an angle that satisfies the total reflection conditions with the surface of the sample 17 from the rear side of the sample 17 via the transparent substrate. At this time, light is not transmitted upward (FIG. 7) through the surface of the sample 17, but evanescent light leaks out through the surface within a very close vicinity 0.1 μm or less from the surface of the sample 17.

When x-y scanning is done while the tip (tip 5) distal ends of a plurality of SNOM probes contact the sample 17, the evanescent light components enter the waveguide 28 via the micro apertures of the SNOM probes, and are detected by the light-receiving element 19. The detected signals are I/V-converted and are input to a multiplexer to obtain multi SNOM signals.

By plotting the magnitudes of such SNOM signals, an SNOM observation image of the sample 17 can be obtained.

[Third Embodiment]

Figure 8:
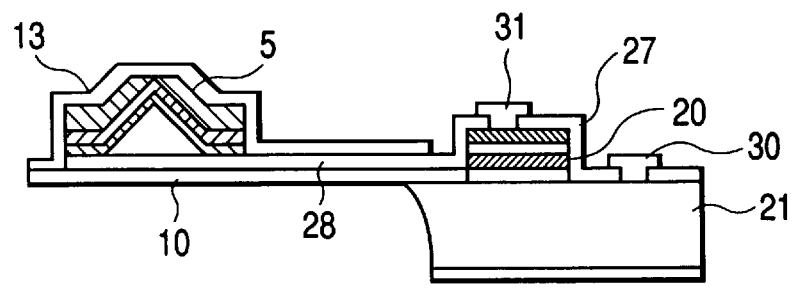
FIG. 8 is a sectional view showing a probe according to the third embodiment of the present invention.
Figure 9A:
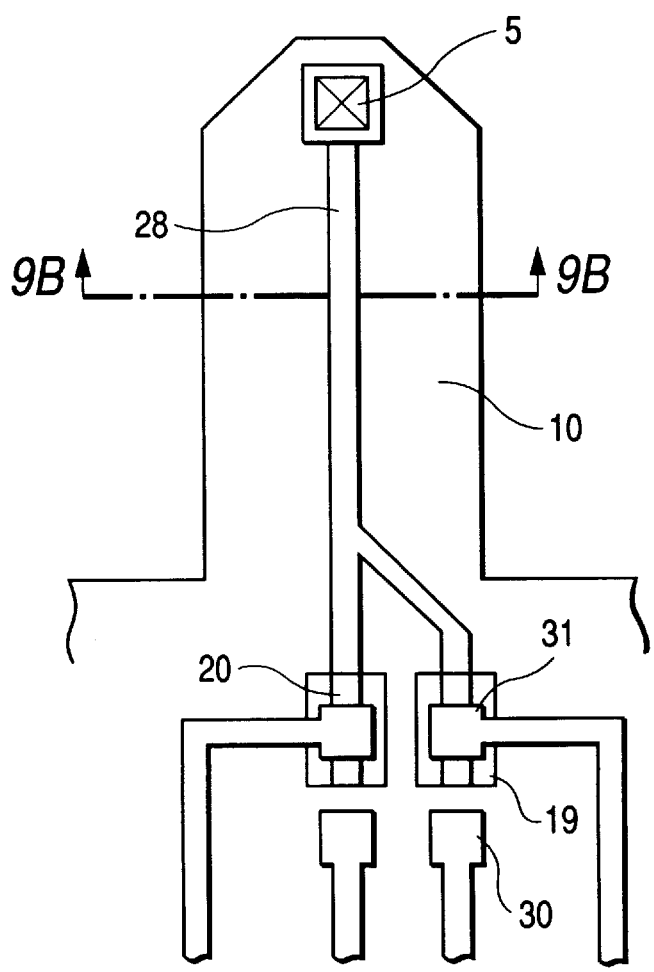
FIG. 9A is a top view showing the probe of the third embodiment.
Figure 9B:
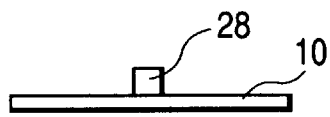
FIG. 9B is a sectional view taken along a line 9B—9B in FIG. 9A.

The third embodiment is directed to still another evanescent light probe and its manufacturing method according to the present invention. FIGS. 8, 9A and 9B show the structure of the probe.

The probe of this embodiment comprises an elastic lever 10 formed on a substrate 21, an evanescent light tip 5 formed on the free end portion of the elastic lever, a light-receiving element 19, a laser 20, and a waveguide 28 for optically connecting the light-receiving element 19 and laser 20 to the tip 5.

When the laser 20 used in the first embodiment and the light-receiving element 19 used in the second embodiment are connected to the tip (tip), return light of evanescent light irradiated from the tip onto a recording medium 18 can be detected. In this embodiment, a plurality of probes are disposed on the second substrate 21.

FIGS. 10A to 10G are sectional views showing the manufacturing processes of the evanescent light probe according to this embodiment.

The manufacturing method will be explained below with reference to FIGS. 10A to 10G.

A (100) single-crystal silicon wafer was prepared as a first substrate 1.

A 100-nm thick silicon thermal oxide film was formed as a protection layer 2. A desired portion of the protection layer 2 was patterned by photolithography and etching to expose 10-μm$^2$ silicon. The silicon exposed from the patterned portion was etched by crystallographic axis anisotropic etching using an aqueous potassium hydroxide solution. Note that the etching conditions were: a 30% aqueous potassium hydroxide solution was used, and a solution temperature of 90° C. and an etching time of 10 min were set. At this time, an inverted pyramidal recess portion 3 having a depth of about 7 μm and surrounded by four surfaces equivalent to the (111) plane was formed (see FIG. 10A).

The thermal oxide film as the protection layer 2 was then removed by an aqueous solution mixture of hydrogen fluoride and ammonium fluoride (HF:NH$_4$F=1:5).

After the removal, the first substrate 1 was washed using a solution mixture of sulfuric acid and hydrogen peroxide heated to 120° C., and a 2% aqueous hydrofluoric acid solution. The first substrate 1 was heated to 1,000° C. in an oxygen/hydrogen atmosphere using an oxidization oven to deposit a 500-nm thick silicon dioxide (SiO$_2$) film serving as a peeling layer 4 (see FIG. 10B).

The film formation for the material of the tip 5 was done. Two different polyimide materials having different refractive indices were prepared. A polyimide film a 11, a polyimide film b 12 serving as a light transmission layer 8, and another polyimide film a 11 were formed all by spin coating. The obtained multilayered structure was patterned by photolithography and etching. In this embodiment, polyimide was used. Alternatively, silicon oxide films having different refractive indices may be formed by sputtering to obtain a layer structure. In this case, different compositions can be obtained by changing the O$_2$ flow rate upon sputtering, and films having different refractive indices can be formed (see FIG. 10C).

A 300-μm thick single-crystal n-InP substrate was used as a second substrate 21, and a 1-μm thick n-InP buffer layer 22, a 0.1-μm thick InGaAsP active layer 23, a 1.5-μm thick p-InP cladding layer 24, and a 0.3-μm thick p-InGaAs capping layer 25 were formed in turn on the substrate 21 by MOCVD (metal organic chemical vapor deposition) (see FIG. 10D).

The obtained multilayered structure was patterned and etched by photolithography to form a ridge structure, thus obtaining a laser 20. Etching was done by RIBE (reactive ion beam etching) using Cl$_2$ gas. A 3-μm thick SiO$_2$ film as a lever material, insulating layer 27, and mask layer 29 was formed on both surfaces of the structure by sputtering. The SiO$_2$ films on both surfaces were patterned and etched by photolithography to form contact holes, a cantilever structure, and a mask layer 29. The thickness of the cantilever was 1 μm.

A 200-nm thick AuGe film and 300-nm thick Au film were deposited by vacuum evaporation, and were patterned and etched by photolithography to form a bonding layer 26, wiring electrode 33, and output electrode 30 on the substrate side. In this case, Au etching used ion milling to taper the waveguide connection portion of the bonding layer.

A 3-μm thick polyimide film serving as a waveguide 28 was deposited by spin coating. The waveguide 28 was then formed by photolithography and etching.

The waveguide 28 had a height of 2 μm and a width of 5 μm. A 50-nm thick Cr film and 300-nm Au film were deposited by vacuum evaporation, and were patterned and etched by photolithography to form an output electrode 31 of the capping layer (see FIG. 10E).

After the tip 5 on the first substrate 1 and the bonding layer 26 on the second substrate 21 were aligned to face each other, they were brought into contact with each other and were pressurized, thus bonding the tip 5 and the bonding layer 26 (pressure bonding) (FIG. 10F). The first and second substrates 1 and 21 were separated from each other to peel the peeling layer 4 and tip 5 at their interface.

After a protection film was formed on the surface of the second substrate, the n-InP substrate was etched from its rear surface using an aqueous HCl solution to form an SiO$_2$ cantilever.

The tip distal end was polished by scanning the sample surface to form a micro aperture having a diameter of about 20 nm on the polyimide layer a 11 to expose the polyimide layer b 12 therefrom. With this structure, light is output from the vertex portion of the polyimide layer b 12. After that, in order to improve wear resistance, a diamond film was formed on the probe surface (FIG. 10G).

FIG. 11 shows the arrangement of a recording/reproduction apparatus using the probes of this embodiment. A recording medium 18 is placed on a holder on an x-y-z scanner. The probes of this embodiment are set to oppose the recording medium 18, and x-y scanning is done while the tips 5 contact the recording medium 18. An information recording voltage signal is demultiplexed by a demultiplexer, and the demultiplexed signals are supplied to the lasers 20 of the individual probes via V/I conversion circuits, thus making the tips 5 emit evanescent light.

Upon recording, the laser beam power is increased to change the state of the recording medium. Upon reproduction, the laser beam power is dropped to read information while maintaining the state of the recording medium.

As a recording medium used in the recording/reproduction apparatus, i.e., as an example of a recording medium whose optical characteristics are changed by the applied voltage, pentacosa-10,12-diynoic acid in which upon application of a voltage, the structure of diacetylene derivative polymer changes by Joule heat produced by currents that locally flow and the peak wavelength of the light absorption band shifts, as described in Japanese Laid-Open Patent Application No. 4-90152, is known.

On the other hand, as an example of a recording medium whose optical characteristics change upon application of a voltage under irradiation of light, an azo compound having quinone and hydroquinone groups, which forms redox pairs due to cis-trans photoisomerization in response to only incoming light and causes proton movement among these redox pairs upon application of an electric field, as described in Japanese Laid-Open Patent Application No. 2-98849, is known.

[Fourth Embodiment]

This embodiment is directed to an evanescent light probe and its manufacturing method according to the present invention. FIGS. 12A to 12F show the manufacturing method and structure of the probe. The probe of this embodiment comprises an elastic lever 10 formed on a second substrate 21, a tip 5 which is formed on the free end portion of the elastic lever and irradiates evanescent light, a surface-emission laser 20 on the surface of a third substrate bonded to the second substrate 21.

The manufacturing method will be explained below with reference to FIGS. 12A to 12F.

Figure 12A:
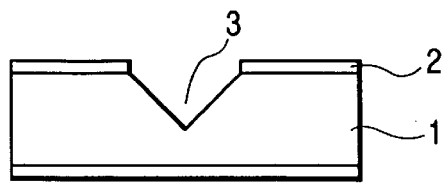
FIGS. 12A, 12B, 12C, 12D, 12E and 12F are sectional views showing the manufacturing processes of a probe according to the fourth embodiment of the present invention.
Figure 12B:
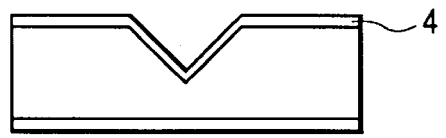
Figure 12C:
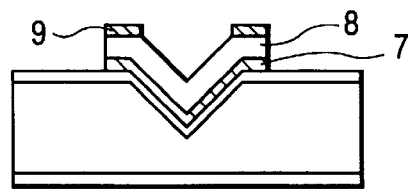
Figure 12D:
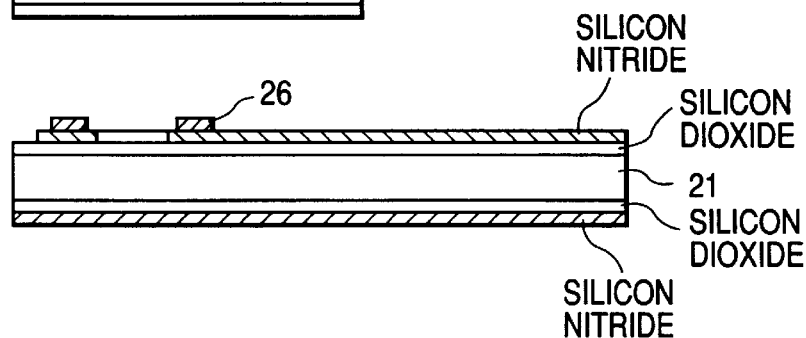

Following the same procedures as in the first embodiment, a tip 5 made up of a metal layer 7, light transmission layer 8, and bonding assist layer 9 was formed (see FIGS. 12A, 12B, and 12C).

A 200-μm thick single-crystal silicon substrate was prepared as a second substrate 21, and a 300-nm thick silicon dioxide film and 200-nm thick silicon nitride film were deposited on both surfaces of the substrate respectively by thermal oxidation and low-pressure chemical vapor deposition (LPCVD). The silicon nitride film on the surface was patterned to have a lever shape. A 5-nm thick chromium film and 50-nm thick gold film were then deposited and were patterned to form a bonding layer 26 (see FIG. 12D).

Figure 12E:
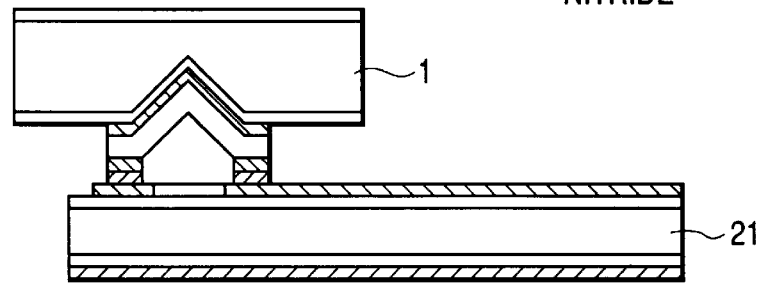
Figure 12F:
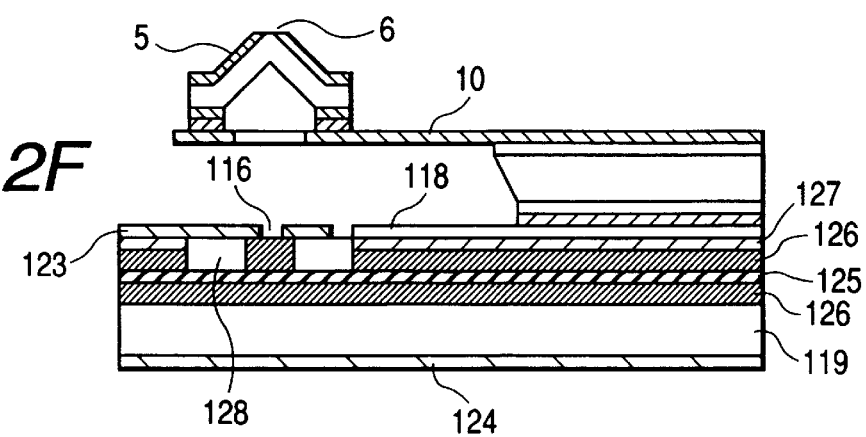

After the tip 5 on the first substrate 1 and the bonding layer 26 on the second substrate 21 were aligned to face each other, they were brought into contact with each other and were pressurized, thus bonding the tip 5 and the bonding layer 26 (pressure bonding) (FIG. 12E).

The first and second substrates 1 and 21 were separated from each other to peel the peeling layer 4 and tip 5 at their interface. The silicon dioxide film and silicon nitride film on the rear surface were patterned to form an opening. After a protection film was formed on the surface, the second substrate 21 was etched using an aqueous potassium hydroxide solution, and the silicon dioxide film on the surface was also etched, thus forming a lever 10.

The tip distal end was polished by scanning the sample surface with a load to form a micro aperture having a diameter of about 20 nm on the metal layer 7, thus exposing the light transmission layer 8 therefrom.

Subsequently, a third substrate 119, on which light-emitting elements 116 comprising surface-emission lasers were disposed in a matrix at a position corresponding to the tip 5 on the second substrate 21, was prepared. The third substrate 119 is obtained by forming anodes 123, cathode 124, active layer 125, mirror layers 126, silicon nitride layer 127, and polyimide layer 128 on a gallium arsenide substrate. The anodes 123 are connected to the individual light-emitting elements 116 to independently drive them. The silicon nitride layer 127 is formed to attain insulation of the anode 123. The cathode 124 is a common electrode. When a voltage is applied across the anode 123 and cathode 124, a laser beam produced in the active layer 125 is reflected by the upper and lower mirror layers 126, and is emitted from the upper opening. After the third substrate was prepared, the second and third substrates 21 and 119 were bonded to each other using an epoxy resin 118 after they were aligned so that laser beams coming from the light-emitting elements 116 were directly guided to the tip 5 and the opening (see FIG. 12F).

The multi light probe was manufactured by the above-mentioned processes.

Figure 13:
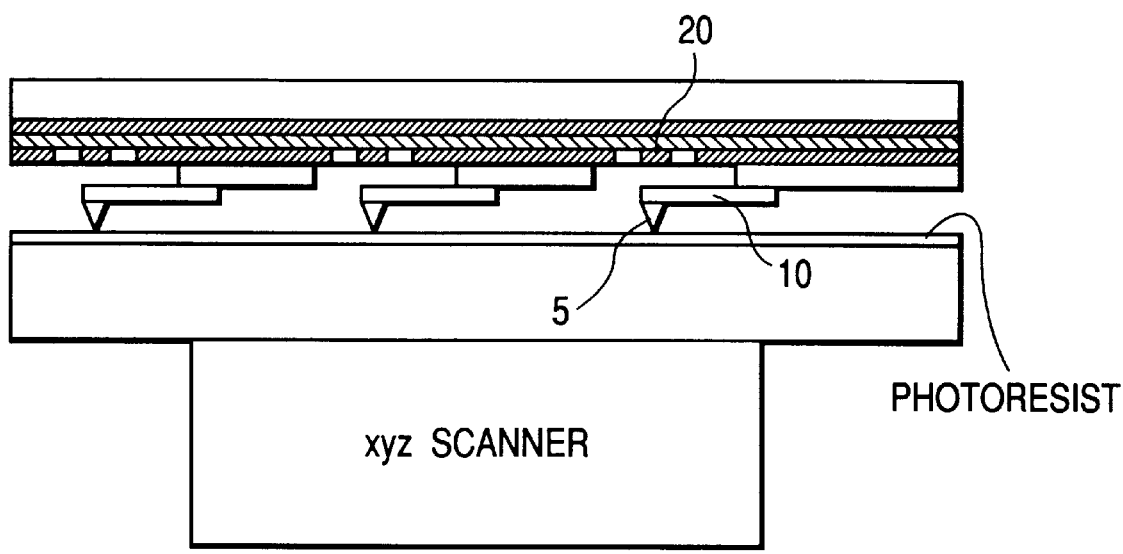
FIG. 13 is a view showing the arrangement of an exposure apparatus using the probe of the fourth embodiment.
Figure 14A:
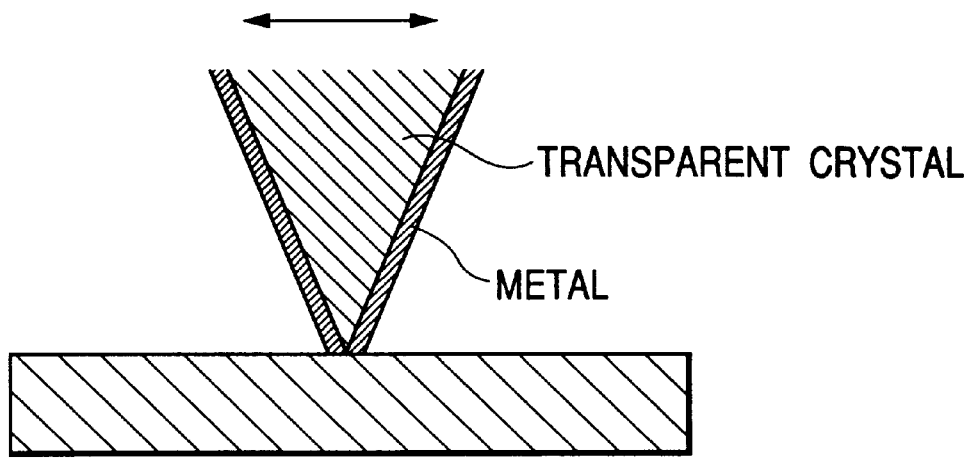
FIGS. 14A and 14B are views showing the conventional methods of manufacturing a probe.
Figure 14B:
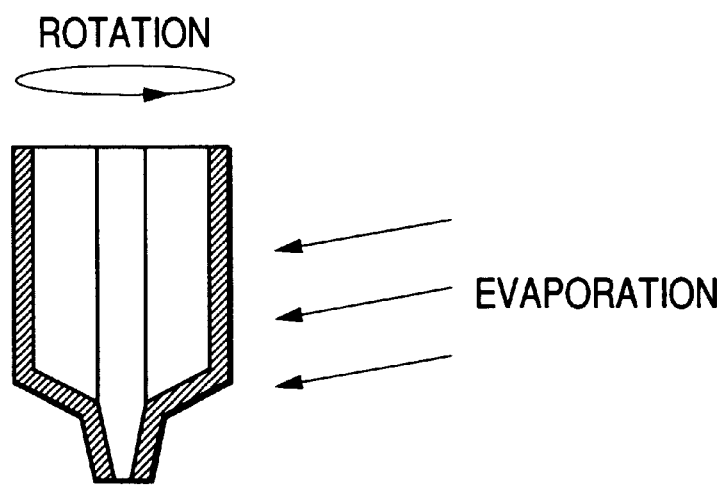

FIG. 13 shows the arrangement of an exposure apparatus using the multi probe of this embodiment. A substrate applied with photoresist is placed on a holder on an x-y-z scanner. The probe of this embodiment is set to oppose the photoresist, and x-y scanning is done while the tip 5 contacts the photoresist. By ON/OFF-controlling evanescent light to be irradiated from the tip 5 onto the photoresist surface, a micropattern can be formed, and high exposure speed can be realized.

This embodiment has exemplified the probe structure that directly guides light coming from each light-emitting element to the tip. Alternatively, as in the second embodiment, a light-receiving element may be formed in place of the light-emitting element, and light detected by the tip may be directly guided to the light-receiving element. In this case, the light-shielding layer with a micro aperture is not always required, as in the second embodiment.

In the above-mentioned embodiments, the tip is supported by the cantilever. However, the present invention is not limited to such specific support structure. For example, a double-supported lever type, torsion lever type, or the like may be used as the support structure. In case of the cantilever type and double-supported lever type, the support member must be an elastic member, but in case of the torsion lever type, the support member is not limited to an elastic member.

What is claimed is:

1. A probe for detecting or irradiating light comprising:
   a substrate;
   a cantilever fixed to said substrate at a fixed end and having a free end opposite to the fixed end;
   a hollow tip having an empty space inside and formed on the free end of said cantilever, said tip comprising a light-transmission material layer and a light-shielding layer covering at least part of the light-transmission material layer and having a micro aperture formed therein;
   at least one of a light-emitting element and a light-receiving element provided on said substrate; and
   an optical waveguide at least part of which is formed on said cantilever,
   wherein said at least one of said light-emitting element and said light-receiving element is optically connected to the light-transmission material layer of said tip through said optical waveguide and the empty space.

2. A probe according to claim 1, wherein said light-shielding layer comprises a metal material.

3. A probe according to claim 1, wherein said light-shielding layer has a different refractive index than said light transmission layer.

4. A probe according to claim 1, wherein said substrate comprises a compound semiconductor substrate.

5. A probe according to claim 4, wherein said light-emitting element comprises a semiconductor laser.

6. A probe according to claim 1, further comprising a diffracting grating formed near said tip on said optical waveguide.

7. A probe according to claim 1, further comprising a bonding layer for bonding said tip to the free end of said cantilever.

8. A probe according to claim 7, wherein said bonding layer has a tapered portion and at least part of said optical waveguide is formed on the tapered portion.

9. A probe for detecting or irradiating light, comprising:
   a substrate;
   a support member formed on said substrate;
   a cantilever fixed to said support member at a fixed end and having a free end opposite to the fixed end, said cantilever being supported such that a space is formed between said cantilever and said substrate;
   a hollow tip having an empty space inside and formed on the free end of said cantilever, said tip comprising a light-transmission material layer and a light-shielding layer covering at least part of the light-transmission material layer and having a micro aperture formed therein; and
   at least one of a light-emitting element and a light-receiving element provided on said substrate at a position facing said tip
   wherein said at least one of said light-emitting element and said light-receiving element is optically connected to the light-transmission material layer of said tip through the empty space and the space is formed between said cantilever and said substrate.

10. A probe according to claim 9, wherein said light-shielding layer comprises a metal material.

11. A probe according to claim 9, wherein said light-shielding layer has a different refractive index than said light transmission layer.

12. A probe according to claim 9, wherein said substrate comprises a silicon substrate.

13. A probe according to claim 12, wherein said light-emitting element comprises a surface-emission laser.

14. A probe according to claim 9, further comprising a bonding layer for bonding said tip to the free end portion of said cantilever.

* * * * *

UNITED STATES PATENT AND TRADEMARK OFFICE
CERTIFICATE OF CORRECTION

PATENT NO. : 6,201,226 B1  
DATED : March 13, 2001  
INVENTOR(S) : Yasuhiro Shimada et al.

Page 1 of 1

It is certified that error appears in the above-identified patent and that said Letters Patent is hereby corrected as shown below:

<u>Column 6,</u>  
Line 39, "min" should read -- min. --; and  
Line 41, "a inverted" should read -- an inverted --.

<u>Column 8,</u>  
Line 27, "min" should read -- min. --.

<u>Column 13,</u>  
Line 28, "light" should read -- light, --.

<u>Column 14,</u>  
Line 29, "tip" should read -- tip, --.

Signed and Sealed this

Twenty-sixth Day of February, 2002

Attest:

JAMES E. ROGAN  
*Attesting Officer*     *Director of the United States Patent and Trademark Office*